(12) United States Patent
Tailliet (10) Patent No.: US 8,810,272 B2
(45) Date of Patent: Aug. 19, 2014

(54) METHOD OF TESTING A STRUCTURE PROTECTED FROM OVERVOLTAGES AND THE CORRESPONDING STRUCTURE

(75) Inventor: François Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 481 days.

(21) Appl. No.: 13/183,845

(22) Filed: Jul. 15, 2011

(65) Prior Publication Data

US 2012/0014024 A1 Jan. 19, 2012

(30) Foreign Application Priority Data

Jul. 15, 2010 (FR) ...................................... 10 55755

(51) Int. Cl.

| | | |
|---|---|---|
| G01R 31/02 | (2006.01) | |
| G01R 31/04 | (2006.01) | |
| G01R 31/40 | (2014.01) | |
| H01L 21/66 | (2006.01) | |
| G01R 3/00 | (2006.01) | |
| H02H 3/20 | (2006.01) | |
| H01L 27/02 | (2006.01) | |
| G01R 1/00 | (2006.01) | |

(52) U.S. Cl.
CPC .............. *H01L 27/0255* (2013.01); *H01L 22/14* (2013.01); *G01R 3/00* (2013.01); *H02H 3/20* (2013.01); *G01R 1/00* (2013.01)
USPC .. 324/762.01; 324/537; 324/538; 324/764.01

(58) Field of Classification Search
CPC ........ G01R 1/00; G01R 3/00; H01L 27/0255; H01L 22/14; H02H 3/20
USPC ........................ 324/762.01, 537, 538, 764.01
See application file for complete search history.

(56) References Cited

U.S. PATENT DOCUMENTS

| | | | |
|---|---|---|---|
| 6,028,324 A * | 2/2000 | Su et al. | 257/48 |
| 6,530,068 B1 | 3/2003 | Cao et al. | |
| 2006/0226485 A1* | 10/2006 | Arakawa | 257/347 |
| 2009/0140748 A1* | 6/2009 | Lindsey et al. | 324/538 |
| 2009/0287435 A1* | 11/2009 | Ker et al. | 702/64 |

* cited by examiner

*Primary Examiner* — Jermele M Hollington
*Assistant Examiner* — Farhana Hoque
(74) *Attorney, Agent, or Firm* — Slater & Matsil, L.L.P.

(57) ABSTRACT

An electronic device includes an electronic component and a protection circuit configured to protect the component from overvoltages. A control circuit is configured to inhibit a part of the protection circuit in the presence of a test voltage across terminals of the component.

39 Claims, 6 Drawing Sheets

METHOD OF TESTING A STRUCTURE PROTECTED FROM OVERVOLTAGES AND THE CORRESPONDING STRUCTURE

CROSS-REFERENCE TO RELATED APPLICATIONS

This application is a translation of and claims the priority benefit of French patent application number 10-55755, filed on Jul. 15, 2010, which is hereby incorporated by reference to the maximum extent allowable by law.

TECHNICAL FIELD

The invention relates to integrated circuits, and more particularly to the protection of certain integrated circuit structures from overvoltages, for example, due to electrostatic discharges, and to the testing of these structures thus protected.

BACKGROUND

Overvoltages may be due to antenna effects. This is because, during etching, essentially plasma etching, of the conducting tracks in the BEOL (back end of line) part, which are typically made of metal, the plasma tends to electrically charge the lines etched, all the more so if these lines are of substantial size. Such a line then forms an antenna for a structure, for example a capacitor, which is connected to it and the charges accumulated in the antenna during the etching may drain via the structure, at the risk of damaging it.

These overvoltages may also be due to various charge accumulations caused for example by friction, between flows of liquids or gases and the surfaces of the semiconductor wafers, and also during manual or automatic handling of the wafers.

In CMOS, MOS, BiCMOS technologies especially, these metal lines are often connected to thin oxides able to withstand only very low voltages (typically less than 5 volts for a CMOS logic technology at less than 0.18 microns). In the case of overvoltages, if no precautions are taken, the draining of the resulting current occurs through the oxides causing them to weaken or even break down.

The reliability of the integrated circuits is therefore affected, especially by output losses and faults, gate-oxide breakdown for example.

The reliability of the test structures for testing these integrated circuits is also affected. These test structures, which are for example placed on the scribe lines of the semiconductor wafers, comprise for example capacitive components, the dielectrics (oxides) of which are representative of those present in the components of the integrated circuit. These test structures thus serve for measuring the quality of the oxides. However, if these test structures have been subjected to overvoltages, the test results will be false.

To prevent this type of problem, measures may be taken during the design phase and during fabrication.

In the design phase, it is endeavored to detect structures at risk with regard to antenna effects. These structures are typically those having a small number of connected junctions relative to the length of the line to which the junctions are connected. The aim is therefore to modify these structures (size/shape, intentional addition of diodes) so as to reduce the ratio of the length to the number of diodes.

During fabrication, particular precautions are taken, especially in the use of etching plasmas and ionized liquids.

The test structures sometimes have a specific characteristic, in particular when they comprise capacitive components. This is because it is necessary to be able to apply, across the terminals of the capacitive component or components, a test voltage equal to the breakdown voltage of the dielectric of the capacitive component. Moreover, if the component is protected from overvoltages by a diode, the latter must have a threshold at least equal to this breakdown voltage. But in this case the diode no longer protects the capacitive component.

An incompatibility therefore presents itself since either the structure is protected from overvoltages and it is not possible to fully test the structure, or it is possible to fully test the structure, by applying a voltage equal to the oxide breakdown voltage, and the structure is then no longer protected from overvoltages.

SUMMARY OF THE INVENTION

According to one method of implementation and embodiment, a method of testing a structure is provided which is compatible with a protection from overvoltages.

According to one aspect, a method is provided of testing an integrated structure comprising an electronic component protected from overvoltages by protection means, comprising inhibiting one part of the protection means in the presence of a test voltage applied across the terminals of the component.

According to one method of implementation, in which the protection means protect the component from overvoltages, across these terminals, having a first polarity, for example negative overvoltages, and from overvoltages, across these terminals, having a second polarity opposite the first, for example positive overvoltages, the part of the protection means protecting the component from the overvoltages having the second polarity is inhibited in the presence of a test voltage having the second polarity.

According to one method of implementation, in which the protection means comprises a first diode, the cathode of which is coupled to a first terminal of the component and the anode of which is coupled to the second terminal of the component, and having an avalanche threshold higher that the test voltage, and a second diode the anode of which is coupled to the first terminal of the component, the second diode is inhibited by reverse-biasing it in the presence of the test voltage.

According to one variant, a resistive element is connected between the cathode of the second diode and the second terminal of the component, and the node common to the resistive element and to the second diode is left floating in the absence of a test voltage.

The reverse-biasing of the second diode may then comprise applying the test voltage to the first terminal of the component and applying a control voltage, having the second polarity and being at least equal to the test voltage but lower than the sum of the test voltage and the avalanche threshold of the second diode, to the common node.

According to another variant, which reduces power consumption, a first transistor is connected between the cathode of the second diode and the second terminal of the component, and in the absence of a test voltage, the node common to the first transistor and to the second diode is left floating and the first transistor is turned on in the presence of an overvoltage having the second polarity. The first transistor in other words is functionally equivalent to a diode.

The reverse-biasing of the second diode may then comprise turning the first transistor off, applying the test voltage to the first terminal of the component and applying a control voltage, having the second polarity and being at least equal to the test voltage but lower than the sum of the test voltage and the avalanche threshold of the second diode, to the common node.

When the integrated structure forms a test structure for an integrated circuit comprising several components and their associated protection means, the second terminals of the components being connected together, the resistive element or the first transistor is then advantageously common to all the components, and according to one method of implementation a test voltage is applied to the first terminal of each component and a control voltage, having the second polarity and being at least equal to the highest of the test voltages but lower than the sum of the highest of the test voltages and the avalanche threshold of the second diodes, is applied to each node common to the resistive element or the first transistor and each second diode.

According to another aspect, an electronic device is provided comprising an integrated structure containing an electronic component, for example a capacitive component, and means for protecting this component from overvoltages, and control means configured to inhibit a part of the protection means in the presence of a test voltage across the terminals of the component.

According to one embodiment, the protection means comprise a first protection circuit, coupled between a first terminal and a second terminal of the component and having a first state in which this circuit is configured so as to protect the component from an overvoltage, across these terminals, having a first polarity, and a second state in which it is inactive with respect to a test voltage, across the terminals of the component, having a second polarity opposite to the first, a second protection circuit, coupled between the first terminal and the second terminal of the component, and having a first state in which this circuit is configured so as to protect the component from an overvoltage, across these terminals, having the second polarity, and a second state in which it is inactive, and the control means are configured so as to place the second protection circuit in its first state in the absence of the test voltage across the terminals of the component and in its second state in the presence of the test voltage across the terminals of the component.

According to one embodiment, the first protection circuit comprises a first diode, the cathode of which is coupled to the first terminal of the component, the anode of which is coupled to the second terminal of the component, and having an avalanche threshold higher than the test voltage, and the second protection circuit comprises a second diode, the anode of which is coupled to the first terminal of the component.

According to one variant, the control means comprise a resistive element coupled between the cathode of the second diode and the second terminal of the component, and a control input, coupled to the node common to the resistive element and to the second diode and being intended to have a floating potential or to receive a control voltage having the second polarity and being at least equal to the test voltage but lower than the sum of the test voltage and the avalanche threshold of the second diode.

According to another variant, the control means comprise a first transistor, coupled between the cathode of the second diode and the second terminal of the component, a control input being coupled to the node common to the first transistor and to the second diode and being intended to have a floating potential or to receive a control voltage having the second polarity and being at least equal to the test voltage but lower than the sum of the test voltage and the avalanche threshold of the second diode, and a control circuit, coupled to the control input, to the cathode of the second diode and to the gate of the first transistor, the control circuit being configured to turn the first transistor off in the presence of the test voltage and to make it functionally equivalent to a diode in the absence of the test voltage.

According to one embodiment, the control circuit comprises a first resistor, connected between the control input and the gate of the first transistor, a second transistor, connected between the gate of the first transistor and ground, a second resistor, connected between the gate of the second transistor and ground, and an activation input, connected to the gate of the second transistor and intended to have a floating potential so as to turn the second transistor off or to receive an activation signal intended to turn the second transistor on.

In order to ensure frequency compensation, it is preferable for the control circuit to furthermore comprise a capacitor connected between the control input and the gate of the first transistor.

According to one embodiment, the integrated structure comprises several components, the second terminals of the components being connected together, several first protection circuits, respectively connected to the components, several second protection circuits, respectively connected to the components, and control means common to all the first and second protection circuits.

The device may form a test structure for an integrated circuit.

According to another aspect a semiconductor wafer is provided, comprising several integrated circuits, separated from one another by scribe lines, and at least one test structure, as defined above, placed on at least one scribe line.

BRIEF DESCRIPTION OF THE DRAWINGS

Other advantages and features of the invention will become clear on examining non-limiting methods of implementation and embodiments, and the appended drawings in which.

DETAILED DESCRIPTION OF ILLUSTRATIVE EMBODIMENTS

Figure 1:
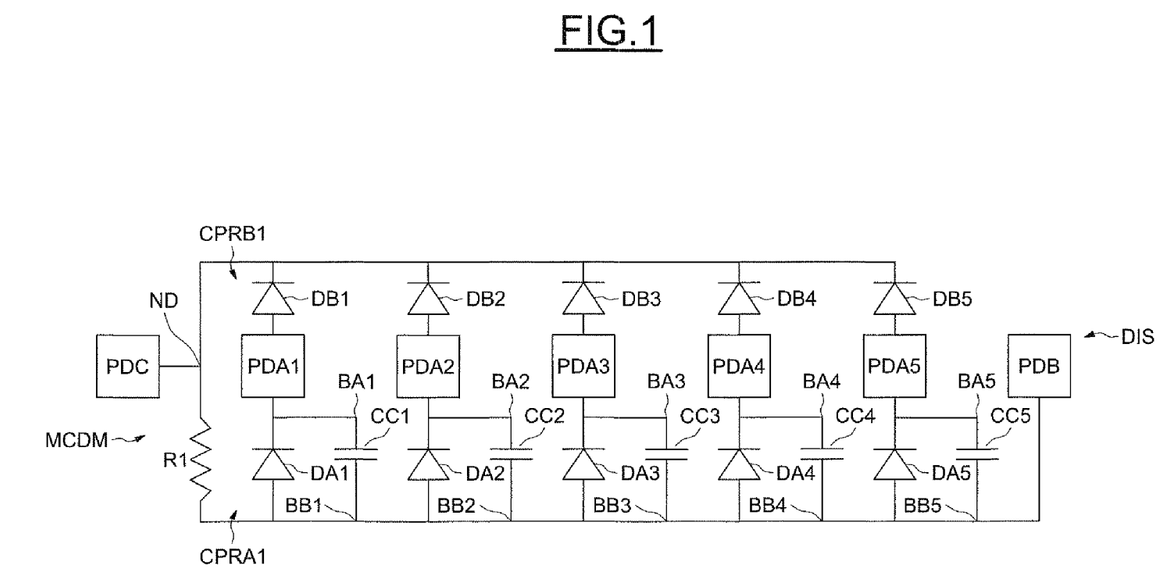
FIG. 1 illustrates schematically an embodiment of a device according to the invention.
Figure 6:
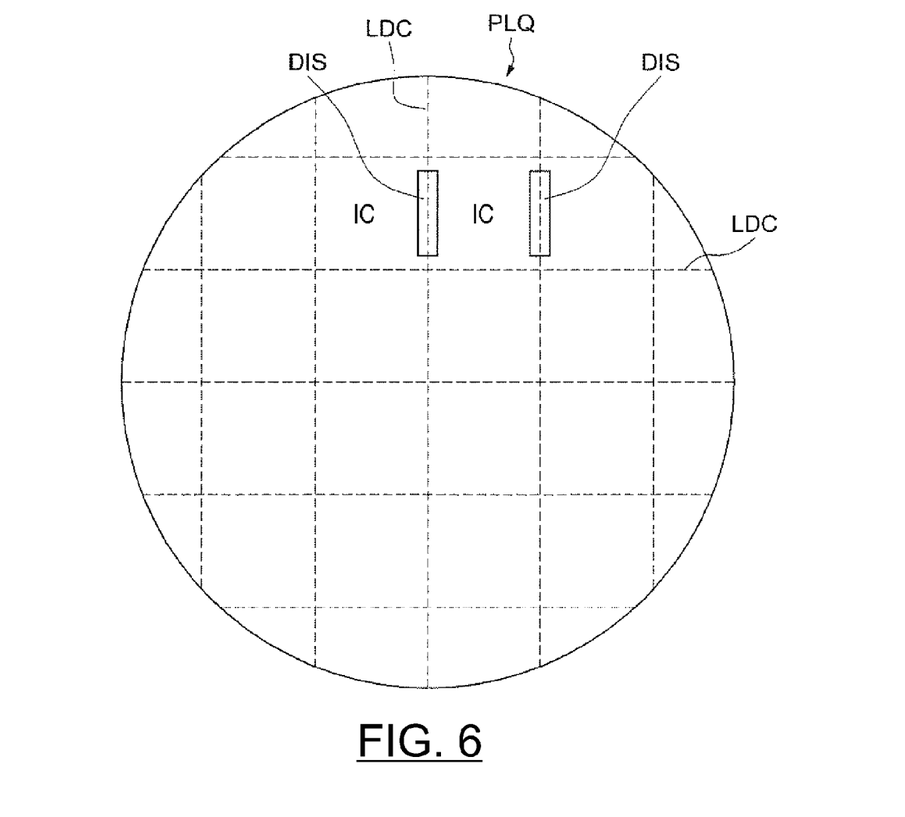
FIG. 6 illustrates schematically an embodiment of a semiconductor wafer according to the invention.

In FIG. 1 the reference DIS denotes a device forming a test structure for an integrated circuit. As illustrated in FIG. 6, such a test structure, also produced in integrated form, is generally placed on scribe lines LDC separating the various integrated circuits IC produced on the semiconductor wafer PLQ.

The test structure DIS comprises, in this example, five capacitive components CC1-CC5 (denoted generally as CCi).

Each capacitive component CCi comprises a first terminal BAi and a second terminal BBi.

The first terminals BAi are respectively coupled to first contact pads PDAi whereas the second terminals BBi are all coupled to the same second contact pad PDB.

A first diode DAi is coupled across the terminals of each capacitive component CCi.

More precisely, in this example, the cathode of the diode DAi is connected to the first terminal BAi of the component, and consequently to the corresponding first contact pad PDAi, and the anode of this diode is connected to the second terminal BBi of the component, and consequently to the contact pad PDB.

A second diode DBi is connected here by its anode to the contact pad PAi and consequently to the first terminal BAi of the corresponding component.

This device DIS also comprises a resistor R1 connected between the cathode of each second diode DBi and the second terminal BBi of each component CCi.

Moreover, an additional contact pad PDC is coupled to the node ND common to the resistor R1 and to each second diode DBi.

When the structure DIS is not under test, the pad PDC is floating, and each contact pad PDAi is grounded via the second diode DBi.

The structure is then protected from overvoltages.

More precisely, each first diode DAi forms a first protection circuit CPRAi intended to protect the component CCi from negative overvoltages. Specifically, if, during an electrostatic discharge for example, a potential difference is applied between the pad PDB and a pad PDAi, such that the potential of the pad PDB is higher than the potential of the pad PDAi, thereby corresponding to a negative overvoltage, then the resulting current will flow through the first diode DAi instead of flowing through the component CCi.

Moreover, each second diode DBi forms a second protection circuit CPRBi intended to protect the component CCi from positive overvoltages. More precisely, if a potential difference is applied between the pad PDAi and the pad PDB, so that the potential of the pad PDAi is higher than the potential of the pad PDB, thereby corresponding to a positive overvoltage, the current will drain through the diode DBi, then through the resistor R1, to the pad PDB.

In contrast, when it is desired to test a component CCi, for example the component CC1, the pad PDB is connected to ground GND (FIG. 2) and a test voltage VTST, here a positive voltage, is applied to the pad PDA1.

Figure 2:
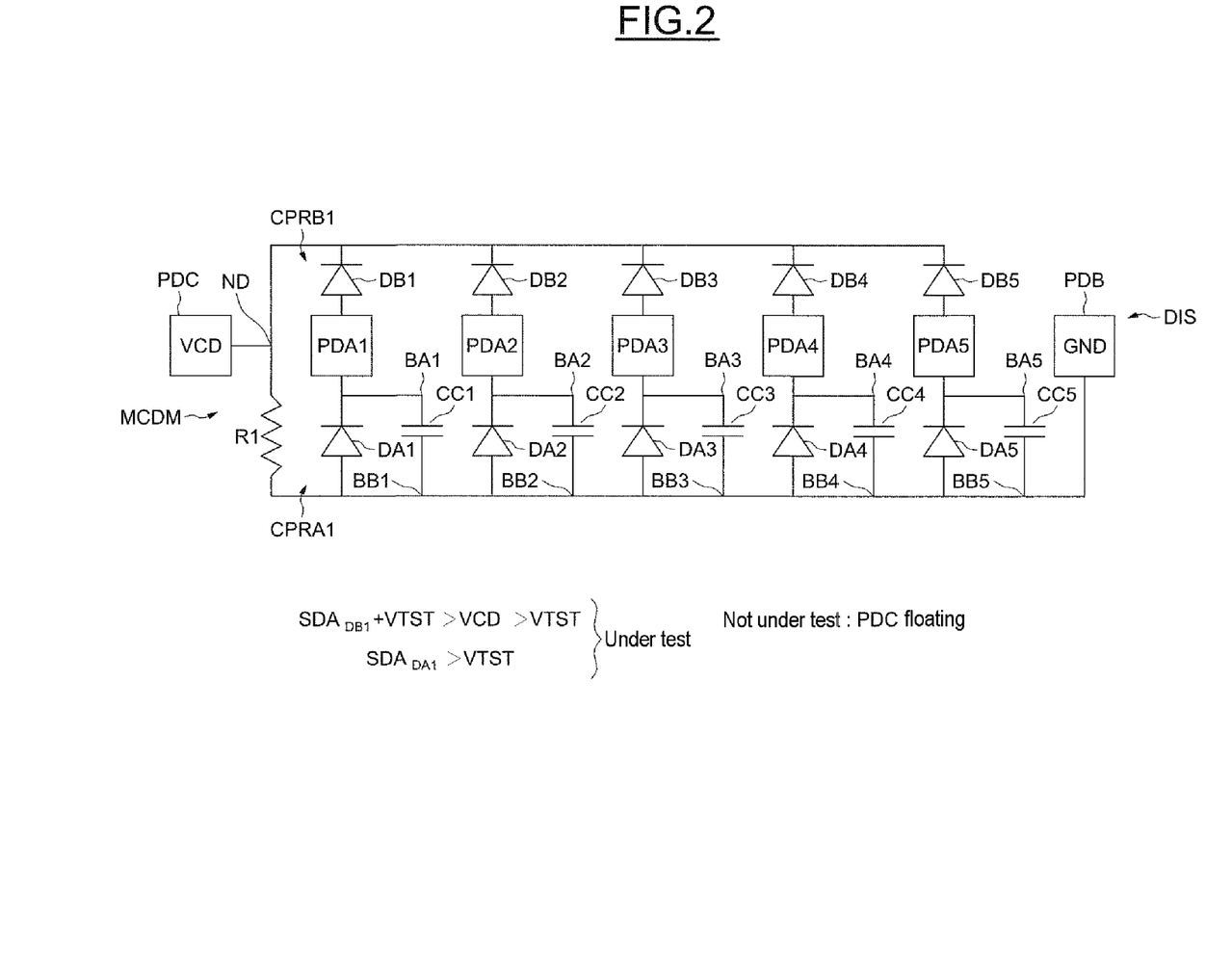
FIGS. 2 and 3 illustrate exemplary test voltages applied to the device in FIG. 1.

Moreover, a positive control voltage VCD is applied to the pad PDC, the control voltage being at least equal to the test voltage VTST, while remaining lower than the sum of this test voltage VTST and the avalanche threshold SDADB1 of the diode DB1. Thus, the diode DB1 is reverse-biased, therefore inhibited or transparent. So as not to interfere with the measurement performed on the component CC1, the diode DB1 is kept from avalanching so that there is no current flowing through this diode.

Moreover, by applying the voltage VTST to the pad PDA1, the diode DA1 is also reverse-biased. Furthermore, its avalanche threshold SDADA1 is chosen to be higher than the voltage VTST so that there is also no current flowing through this diode during the test.

Thus, in the configuration of FIG. 1, i.e., when not under test, the second diode DB1 is in a first state in which it protects the component from positive overvoltages, while the diode DA1 is also in a first state in which it protects the component from negative overvoltages.

In contrast, in the configuration in FIG. 2, the diode DA1 is in a second state in which it is inactive with respect to the test voltage, i.e., it is reverse-biased, allowing a current to flow through the component CC1 when the test voltage VTST is applied, this test voltage possibly being very high and reaching the breakdown voltage of the oxide of the component.

Likewise, during the test, the diode DB1 is placed in a second state in which it is inactive or inhibited because it is reverse-biased.

In this embodiment, the pad PDC and the resistor R1 form control means MCDM making it possible to inhibit the diode DB1 during the test.

Since the diode DA1 is not intended to protect the component from positive overvoltages, it is not inhibited by the control means. It is simply automatically inactive with respect to the test voltage because of its reverse bias.

As has just been seen, the first diodes DAi offer protection from negative overvoltages and are not intended to offer protection from positive overvoltages. Their avalanche voltage is therefore intentionally high, and for example higher than the breakdown voltage of the oxide of the capacitive component CCi. In this regard semiconductor diodes located at the junction between an n-type well and the p-type substrate may be used.

The diodes DBi inject the current due to positive overvoltages into the resistor R1. They may for example be produced by diffusing a p+-type source or drain region into an n-type well.

By way of example, to test a capacitive component having a thin oxide, for example about 3 nanometers thick, or else a tunnel oxide, a control voltage VCD of 15 volts and a test voltage VTST of about 10 to 15 volts may be applied. The resistor R1 is chosen to be of low enough resistance to be able to drain a significant current during positive overvoltages. For example a resistor R1 having a resistance of the order of a kilohm, for example, 1 kilohm, may be used.

Figure 3:
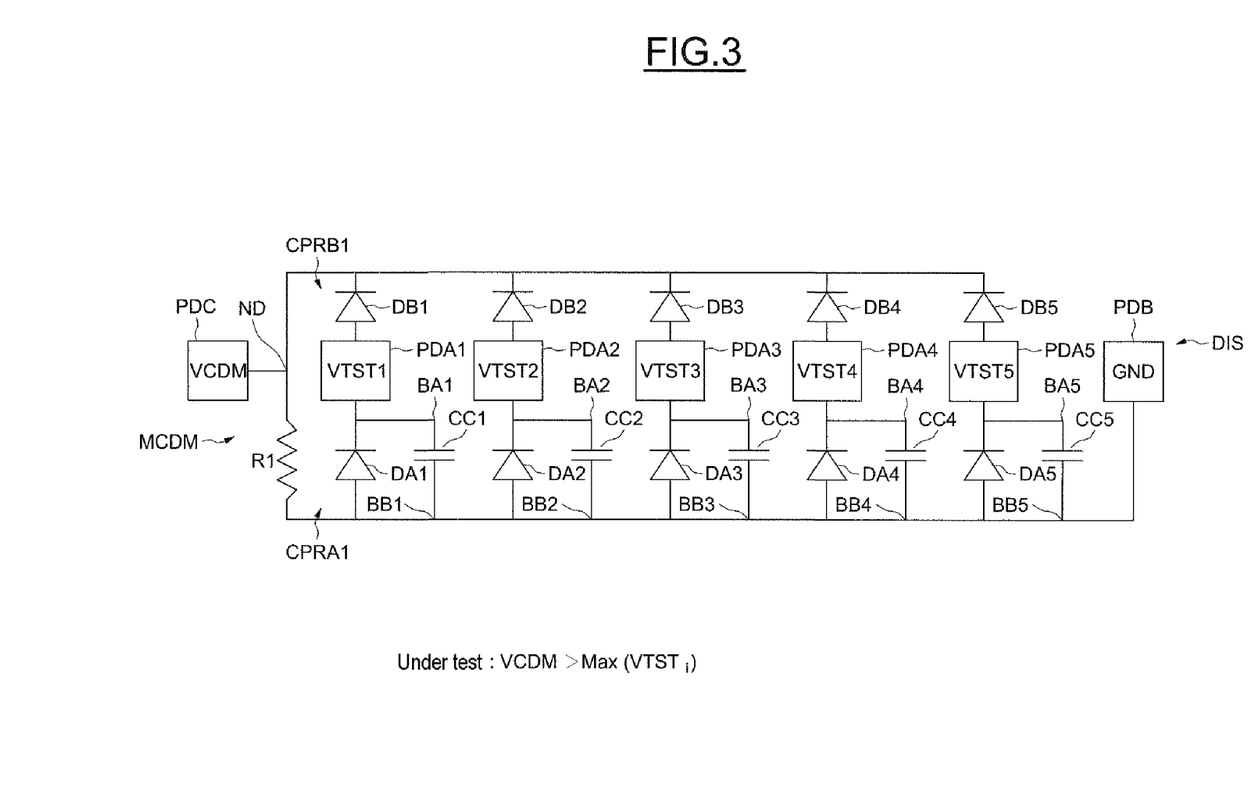

It is quite possible, as illustrated in FIG. 3, to test all the components of the test structure with different test voltages VTST1-VTST5.

In this case, and if it is assumed, as is generally the case, that all the diodes have the same avalanche threshold, the corresponding test voltage VTSTi is applied to each pad PDAi, and a control voltage VCDM, here positive, at least equal to the highest of the test voltages VTSTi, while however remaining lower than the sum of this highest test voltage and the avalanche threshold of the diodes DBi, is applied to the pad PDC.

The device DIS in FIG. 1 is particularly simple to produce. This being so, when the pad PDC reaches the potential of the control voltage VCD, a current equal to VCD/R1, which may in certain cases be substantial and therefore troublesome, is made to flow through the resistor R1.

Figure 4:
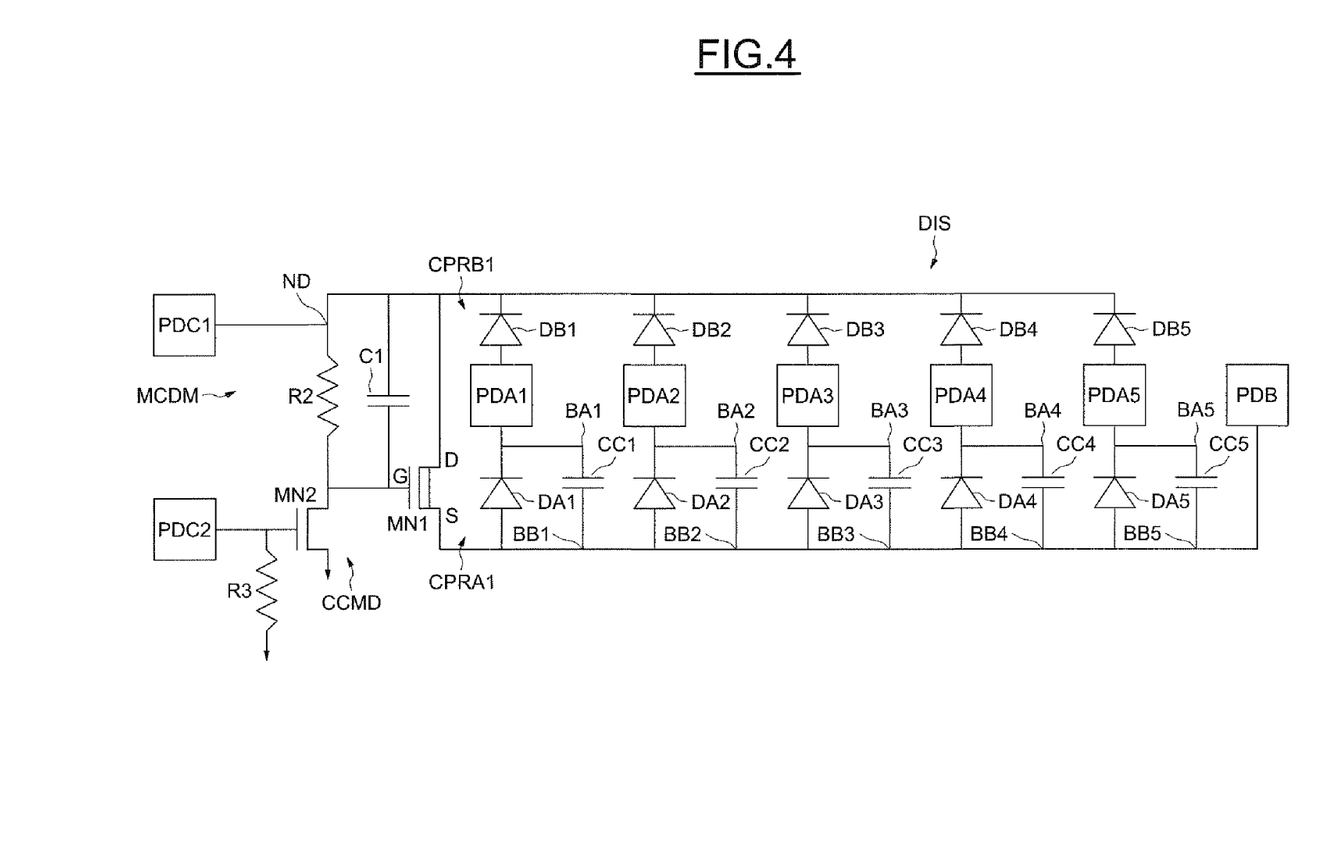
FIG. 4 illustrates schematically another embodiment of a device according to the invention.

This is why, in certain cases, it may be preferable to use a device DIS such as that illustrated in FIG. 4.

In this figure elements analogous to or having analogous functions to those shown in FIG. 1 have been given the same references that they had in FIG. 1. Thus the components CCi, the first protection circuit CPRAi and the second protection circuit CPRBi appear again.

In this embodiment, the control means MCDM comprise a first transistor MN1 the source of which is connected to the second terminals BBi of the components, and consequently to the pad PDB, and the gate of which is connected to the drain via a resistor R2 and a capacitor C1. The drain of the transistor MN1 is moreover connected to the cathodes of the diodes DBi.

The transistor MN1 is preferably intrinsic, i.e., it does not comprise additional implantation doping in its conductive channel, thereby lowering its threshold voltage relative to a conventional transistor. Because of this the threshold for protection from electrostatic discharges is also lowered.

A first control pad PDC1 is coupled to the node ND common to the resistor R2, the capacitor C1, the drain D of the transistor MN1 and each of the diodes DBi.

A second control pad PDC2 is connected to the gate of a second transistor MN2 the drain of which is connected to the gate of the first transistor MN1.

The source of the transistor MN2 is grounded. Finally, the gate of the transistor MN2 is also grounded via another resistor R3.

The control pad PDC2, the transistor MN2, the capacitor C1 and the resistors R2 and R3 here form a circuit CCMD for controlling the transistor MN1.

In this embodiment, the role of the resistor R1 in the embodiment in FIG. 1 is filled by the first transistor MN1. The diodes DAi and DBi play the same role as in the embodiment in FIG. 1.

At rest, i.e., when the structure DIS is not under test, the pads PDC1 and PDC2 are floating. The transistor MN2 is turned off because its gate is grounded via the resistor R3. The transistor MN1 behaves as a diode interposed between the cathodes of the diodes DBi and the pad PDB. The gate of the transistor MN1 is at the potential of its drain. In this configuration, each diode DAi is in its first state, protecting the component CCPi from negative overvoltages.

Likewise, the diode DBi protects the component CCi from positive overvoltages. This is because, in the presence of a positive overvoltage on the pad PDAi, the current flows to the pad PDB through the diode DBi and the transistor MN1, which is in its on-state. The capacitor C1, although not absolutely necessary, ensures frequency compensation and guarantees that the gate potential of the transistor MN1 increases at the same time as that of its drain. This is because, in the absence of the capacitor C1, and in the presence of a very rapid positive overvoltage pulse, the potential of the gate of the transistor MN1 increases less rapidly than the potential of the cathode of the diode DBi. As a result the voltage on the pad PDAi may still be high while the transistor MN1 remains in its off-state.

The presence of the capacitor C1, the capacitance of which is chosen to be high relative to the gate capacitance of the transistor MN1, for example ten times higher, allows this drawback to be obviated and the device DIS to be made effective in the presence of a very rapid positive overvoltage pulse.

Under test, the control circuit CCMD will turn the transistor MN1 off and the control means MCDM will inhibit the diode DB1 (assuming that it is the component CC1 which is being tested by applying a test voltage VTST to the pad PDA1).

The conditions under which the transistor MN1 is turned off are the following:

$$V(PDC1) \times (Ron(MN2))/[R2+Ron(MN2)] < Vt(MN1),$$

where V(PDC1) denotes the voltage applied to the pad PDC1; Ron(MN2) is the drain-source resistance of the transistor MN2 in its on state; and Vt(MN1) is the threshold voltage of the transistor MN1.

This off-state condition means that the transistor MN2 must prevail over R2 so as to keep the gate voltage of the transistor MN1 low, i.e., Ron(MN2) is much lower than R2. An acceptable R2/Ron(MN2) ratio is about one hundred.

Thus under test, the potential of the pad PDC2 is firstly increased as high as the voltage VCD2, for example 5 volts, so as to turn the transistor MN2 on enough to make the drain voltage MN2 lower than the threshold voltage of the transistor MN1. Then, the control voltage VCD1 is applied to the pad PDC1 in a way analogous to that described with reference to the preceding figures. In other words, the voltage VCD1 is at least equal to the test voltage VTST but lower than the sum of this test voltage and the avalanche threshold of the diode DB1.

It may be seen here that, when Ron(MN2) is much lower than R2, the current consumed is equal to VCD1/R2+VCD2/R3.

Figure 5:
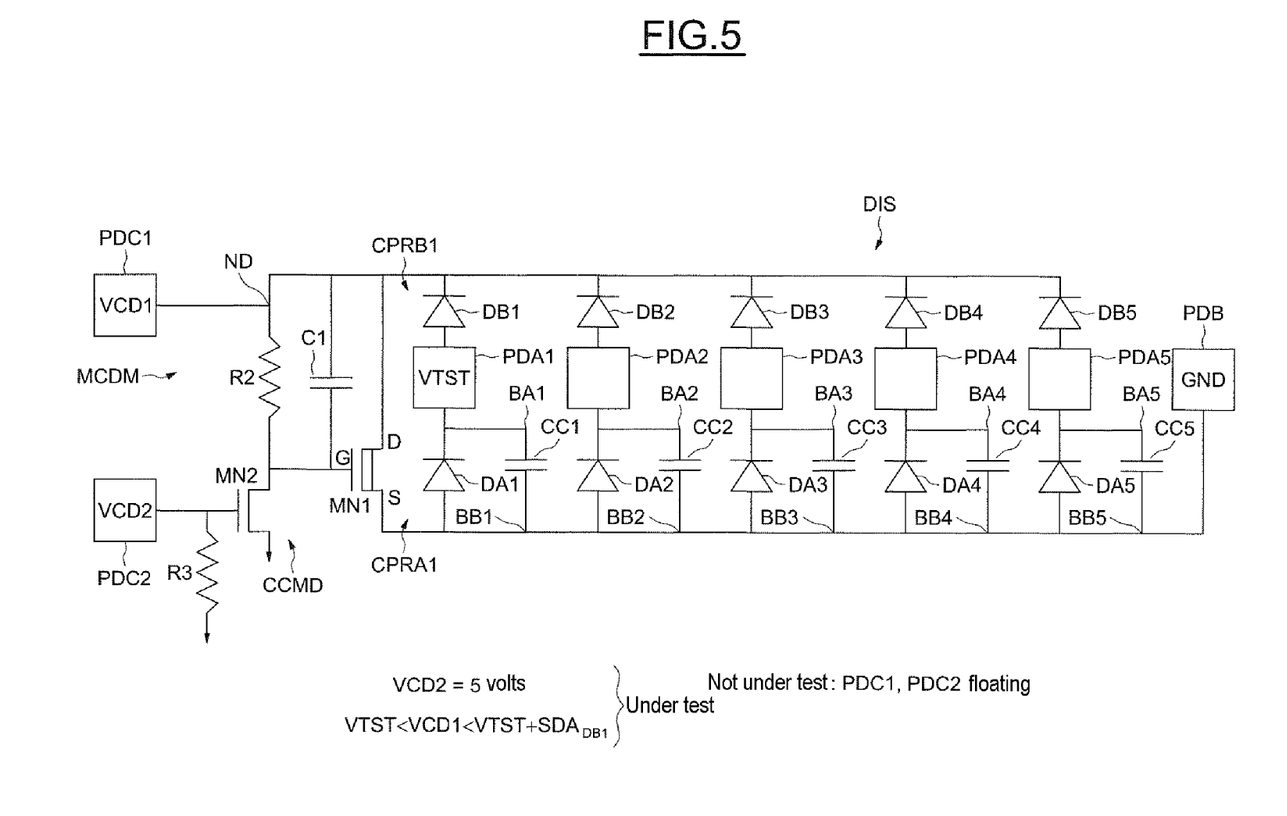
FIG. 5 illustrates exemplary test voltages applied to the device in FIG. 4.

R2 and R3 may have large resistances, for example typically 100 kilohms. This is because, during a positive overvoltage, the current flows through the diode MN1. It may therefore be seen that for a voltage VCD1 equal to 15 volts for example, and a voltage VCD2 equal to 5 volts, the current consumed in the device DIS in FIG. 5 is equal to 150 microamps in R2 and 50 microamps in R3 whereas it is equal to 10 milliamps in R1 (with R1=1 kilohm) in the case of the embodiment in FIG. 1.

As a variant, if the voltage VCD1 must be increased to levels too high relative to the voltage withstand of the transistors MN1 and MN2, it is possible, using known solutions, to obviate these limitations (clipping, cascoding, Zener diodes in series with the drains of MN1 and MN2). By way of example, two 5.5 volt Zener diodes connected in series make it possible to increase the potential VCD1 to 26 volts with the transistors MN1 and MN2 seeing only 15 volts. This is because the clipping level of the voltage on the pad PDC1 then increases to about 11.5 volts, corresponding to the threshold voltages of the two Zener diodes added to the threshold voltage of the transistor MN1.

The invention especially makes it possible to protect such a structure from antenna effects likely to generate overvoltages during the fabrication of the structure and in particular during the etching of metal interconnects. This is because, in this case, the positive overvoltages that are possibly generated are drained via the diodes DBi.

What is claimed is:

1. A method of testing an integrated structure comprising an electronic component protected from overvoltages by a protection circuit, the method comprising:
    applying a test voltage across terminals of the component; and
    simultaneously providing a control signal to the protection circuit to inhibit at least one part of the protection circuit, the control signal being separate from the test voltage, wherein the protection circuit protects the component from overvoltages across the terminals of the component, the overvoltages having either a first polarity or a second polarity, wherein the second polarity is opposite the first polarity.

2. The method according to claim 1, wherein, when the test voltage has the second polarity, the part of the protection circuit protecting the component from the overvoltages having the second polarity is inhibited.

3. A method of testing an integrated structure comprising an electronic component protected from overvoltages by a protection circuit, the method comprising:
    applying a test voltage across terminals of the component; and
    inhibiting one part of the protection circuit in the presence of the test voltage applied across the terminals of the component;
    wherein the protection circuit protects the component from overvoltages across the terminals of the component, the overvoltages having either a first polarity or a second polarity opposite the first polarity, and wherein, when the test voltage has the second polarity, the part of the protection circuit protecting the component from the overvoltages having the second polarity is inhibited, and wherein the protection circuit comprises:
a first diode having a cathode coupled to a first terminal of the component and an anode coupled to a second terminal of the component, the first diode having an avalanche threshold higher than the test voltage; and
a second diode having an anode coupled to the first terminal of the component, the second diode being inhibited by reverse-biasing the second diode in the presence of the test voltage.

4. The method according to claim 3, further comprising a resistive element coupled between the cathode of the second diode and the second terminal of the component, wherein a common node of the resistive element and the second diode is left floating in the absence of the test voltage.

5. The method according to claim 4, wherein the reverse-biasing comprises applying the test voltage to the first terminal of the component and applying a control voltage to the common node, the control voltage having the second polarity and being at least equal to the test voltage but lower than a sum of the test voltage and the avalanche threshold of the second diode.

6. The method according to claim 5, wherein, the integrated structure forms a test structure for an integrated circuit that comprises several components and their associated protection circuits, the second terminals of the components being connected together and the resistive element being common to all the components, wherein a test voltage is applied to the first terminal of each component and the control voltage has the second polarity and is at least equal to the highest of the test voltages but lower than a sum of the highest of the test voltages and the avalanche threshold of the second diodes.

7. The method according to claim 3, further comprising a first transistor coupled between the cathode of the second diode and the second terminal of the component, wherein, in the absence of the test voltage, a node common to the first transistor and to the second diode is left floating and wherein the first transistor is turned on in the presence of an overvoltage having the second polarity.

8. The method according to claim 7, wherein the reverse-biasing of the second diode comprises turning the first transistor off, applying the test voltage to the first terminal of the component and applying a control voltage to the common node, the control voltage having the second polarity and being at least equal to the test voltage but lower than a sum of the test voltage and the avalanche threshold of the second diode.

9. The method according to claim 8, wherein, the integrated structure forms a test structure for an integrated circuit that comprises several components and their associated protection circuits, the second terminals of the components being connected together and first transistor being common to all the components, wherein a test voltage is applied to the first terminal of each component and the control voltage has the second polarity and is at least equal to the highest of the test voltages but lower than the sum of the highest of the test voltages and the avalanche threshold of the second diodes.

10. A method of testing an integrated structure comprising an electronic component coupled in parallel with a first protection device and in series with a second protection device, the method comprising:
in a test mode, testing the component by applying a test voltage across terminals of the component while at the same time causing the first and second protection devices to be turned off using a control signal separate from the test voltage, wherein either the first protection device or the second protection device is turned off based on the control signal; and not in the test mode, protecting the component from overvoltages with the first and second protection devices.

11. The method according to claim 10, wherein the first and second protection devices comprise diodes.

12. The method according to claim 11, wherein protecting the component from overvoltages comprises:
protecting the component from negative overvoltages with the first protection device; and
protecting the component from positive overvoltages with the second protection device.

13. The method of claim 10, wherein
the electronic component and the first protection device are coupled between a first terminal and a second terminal;
the second protection device is coupled between the second terminal and a third terminal;
the test voltage is applied across the first and second terminals; and
the control signal is applied to the third terminal.

14. An electronic device comprising an integrated structure, the integrated structure comprising:
an electronic component;
a protection circuit configured to protect the component from overvoltages; and
a control circuit configured to inhibit a part of the protection circuit in the presence of a test voltage across terminals of the component, wherein the protection circuit comprises:
a first protection circuit coupled between a first terminal and a second terminal of the component, the first protection circuit having a first state in which the first protection circuit is configured to protect the component from an overvoltage having a first polarity across the first and second terminals and a second state in which the first protection circuit is inactive with respect to a test voltage having a second polarity opposite to the first across the first and second terminals of the component; and
a second protection circuit coupled between the first terminal and the second terminal of the component, the second protection circuit having a first state in which the second protection circuit is configured so as to protect the component from an overvoltage having the second polarity across these terminals, and a second state in which the second protection circuit is inactive.

15. The device according to claim 14, wherein the control circuit is configured to place the second protection circuit in the second state in the presence of a test voltage across the terminals of the component having the second polarity, and in the first state in the absence of the test voltage across the terminals of the component.

16. The device according to claim 15, wherein the first protection circuit comprises a first diode having a cathode coupled to the first terminal of the component and an anode coupled to the second terminal of the component, the first diode having an avalanche threshold higher than the test voltage, and wherein the second protection circuit comprises a second diode having an anode coupled to the first terminal of the component.

17. The device according to claim 16, wherein the control circuit comprises a resistive element coupled between the cathode of the second diode and the second terminal of the component and a control input coupled to a node common to the resistive element and to the second diode.

18. The device according to claim 17, wherein the common node is configured to carry a floating potential at a first time or a control voltage at a second time, the control voltage having the second polarity and being at least equal to the test voltage but lower than a sum of the test voltage and the avalanche threshold of the second diode.

19. The device according to claim 15, wherein the first protection circuit comprises a first diode having a cathode is coupled to the first terminal of the component and an anode coupled to the second terminal of the component, the first diode having an avalanche threshold higher than the test voltage, and wherein the second protection circuit comprises a second diode having an anode coupled to the first terminal of the component.

20. The device according to claim 19, wherein the control circuit comprise a first transistor coupled between the cathode of the second diode and the second terminal of the component, a control input of the first transistor being coupled to a node common to the first transistor and to the second diode, the common node configured to carry a floating potential at a first time and a control voltage at a second time, the control voltage having the second polarity and being at least equal to the test voltage and lower than a sum of the test voltage and a breakdown voltage of the second diode, the control circuit further comprising a control unit coupled to the control input, to the cathode of the second diode and to a gate of the first transistor, the control unit being configured to turn the first transistor off in the presence of the test voltage and to make it functionally equivalent to a diode in the absence of the test voltage.

21. The device according to claim 20, wherein the control unit comprises:
    a first resistor connected between the control input and the control input of the first transistor,
    a second transistor coupled between the control input of the first transistor and ground;
    a second resistor coupled between a control input of the second transistor and ground; and
    an activation input coupled to the control input of the second transistor and configured to have a floating potential so as to turn the second transistor off or to receive an activation signal intended to turn the second transistor on.

22. The device according to claim 20, wherein the control unit further comprises a capacitor coupled between the control input and the gate of the first transistor.

23. The device according to claim 14, wherein the component is a capacitive component.

24. The device according to claim 14, wherein the integrated structure comprises several components, the second terminals of the components being connected together, several first protection circuits, respectively connected to the components, several second protection circuits, respectively connected to the components, and control circuits common to all the first and second protection circuits.

25. The device according to claim 14, wherein the device comprises a test structure for an integrated circuit.

26. The device according to claim 25, wherein the device is integrated in a semiconductor wafer comprising a plurality integrated circuits that are separated from one another by scribe lines, and wherein the test structure is located in at least one scribe line.

27. The electronic device of claim 14, wherein:
    the first protection circuit comprises a first diode having a cathode coupled to the first terminal of the component and an anode coupled to the second terminal of the component;
    the second protection circuit comprises a second diode having a cathode coupled to the second terminal of the component and an anode coupled to the first terminal of the component; and
    the control circuit comprises:
        a resistive element coupled between the cathode of the second diode and the second terminal of the component; and
        a control input coupled to a node common to the resistive element and the cathode of the second diode.

28. The device according to claim 27, further comprising a contact pad coupled between the cathode of the first diode, the first terminal of the component and the anode of the second diode.

29. The device according to claim 27, further comprising:
    a plurality of further electronic components, each having a first terminal and a second terminal;
    a plurality of further first diodes, each further first diode having a cathode coupled to the first terminal of a respective further component and an anode coupled to the second terminal of the respective further component;
    a plurality of further second diode, each further second having a cathode coupled to the second terminal and an anode coupled to the first terminal of a respective further component;
    wherein the resistive element is coupled between the cathode of each further second diode and the second terminal of each respective component; and
    wherein the node is common to the cathode of each of the further second diodes.

30. The device according to claim 29, wherein the control input and the resistive element are configured to inhibit the first or second diode in the presence of a test voltage across the first and second terminals of the component.

31. The device according to claim 30, wherein the first diode has an avalanche threshold higher than the test voltage.

32. The device according to claim 30, wherein the control input is configured to carry a floating potential at a first time and a control voltage at a second time, the control voltage having the second polarity and being at least equal to the test voltage but lower than a sum of the test voltage and an avalanche threshold of the second diode.

33. The electronic device of claim 14, wherein:
    the first protection circuit comprises a first diode having a cathode coupled to the first terminal of the component and an anode coupled to the second terminal of the component;
    the second protection circuit comprises a second diode having a cathode coupled to the second terminal of the component and an anode coupled to the first terminal of the component; and
    the control circuit comprises:
        a first transistor with a current path coupled between the cathode of the second diode and the second terminal of the component;
        a first resistor connected between the cathode of the second diode and a gate of the first transistor;
        a second transistor with a current path coupled between the gate of the first transistor and ground; and
        a second resistor coupled between a gate of the second transistor and ground.

34. The device according to claim 33, further comprising an activation input coupled to the gate of the second transistor and configured to have a floating potential so as to turn the second transistor off or to receive an activation signal intended to turn the second transistor on.

35. The device according to claim 33, wherein the first and second transistors and the first and second resistors are configured to inhibit the first or second diode in the presence of a test voltage across the first and second terminals of the component.

36. The device according to claim 35, further comprising a control input coupled to a node common to the first transistor and to the second diode, the control input configured to carry a floating potential at a first time and to receive a control voltage at a second time, the control voltage having the second polarity and being at least equal to the test voltage and lower than a sum of the test voltage and a breakdown voltage of the second diode.

37. The device according to claim 35, wherein the first diode has an avalanche threshold higher than the test voltage.

38. The device according to claim 33, wherein the device is configured to turn the first transistor off in the presence of a test voltage and to make it functionally equivalent to a diode in the absence of the test voltage.

39. An electronic device comprising an integrated structure, the integrated structure comprising:
- an electronic component;
- protection means for protecting the component from overvoltages having either a first polarity or a second polarity, wherein the second polarity is opposite the first polarity; and
- control means for generating a control signal for inhibiting a part of the protection means while simultaneously applying a test voltage across terminals of the component, wherein when the test voltage has the first polarity, the part of the protection means protecting the component from the overvoltages having the first polarity is inhibited.

* * * * *